United States Patent
Correale, Jr.

(10) Patent No.: US 7,919,819 B2
(45) Date of Patent: *Apr. 5, 2011

(54) INTERCONNECT COMPONENTS OF A SEMICONDUCTOR DEVICE

(75) Inventor: Anthony Correale, Jr., Raleigh, NC (US)

(73) Assignee: International Business Machines Corporation, Armonk, NY (US)

( * ) Notice: Subject to any disclaimer, the term of this patent is extended or adjusted under 35 U.S.C. 154(b) by 22 days.

This patent is subject to a terminal disclaimer.

(21) Appl. No.: 12/351,015

(22) Filed: Jan. 9, 2009

(65) Prior Publication Data

US 2009/0114952 A1    May 7, 2009

Related U.S. Application Data

(63) Continuation of application No. 11/167,752, filed on Jun. 27, 2005, now Pat. No. 7,492,013.

(51) Int. Cl.
*H01L 29/72* (2006.01)

(52) U.S. Cl. ........ 257/368; 257/203; 257/206; 257/737; 257/758; 257/776

(58) Field of Classification Search ............... 257/368, 257/203, 206, 737, 758, 776
See application file for complete search history.

(56) References Cited

U.S. PATENT DOCUMENTS

| | | | |
|---|---|---|---|
| 4,928,160 A | 5/1990 | Crafts | |
| 5,341,310 A | 8/1994 | Gould et al. | |
| 6,430,733 B1 | 8/2002 | Cohn et al. | |
| 7,492,013 B2 * | 2/2009 | Correale, Jr. | 257/368 |
| 2002/0057605 A1 | 5/2002 | Yamakoshi | |
| 2002/0140106 A1 | 10/2002 | Kurjanowicz | |

* cited by examiner

*Primary Examiner* — Edward Wojciechowicz
(74) *Attorney, Agent, or Firm* — Ian D. MacKinnon; Schubert Law Group PLLC

(57) ABSTRACT

Embodiments comprise an adjusted polysilicon gate pitch to metal wire pitch relationship to improve area scalars while increasing ACLV tolerance with a fixed polysilicon gate pitch. In some embodiments, the wire pitch for at least one metallization layer is adjusted to match the pitch for the polysilicon gate. In one embodiment, the next to the lowest metallization layer running in the same orientation as the polysilicon gate, utilized to access the input or output of the interconnected cell structures is relaxed to match the minimum contacted gate pitch and the metal is aligned above each polysilicon gate. In another embodiment, the polysilicon gate pitch may be relaxed to attain a smaller lowest common multiple with the wire pitch for an integrated circuit to reduce the minimum step off.

20 Claims, 9 Drawing Sheets

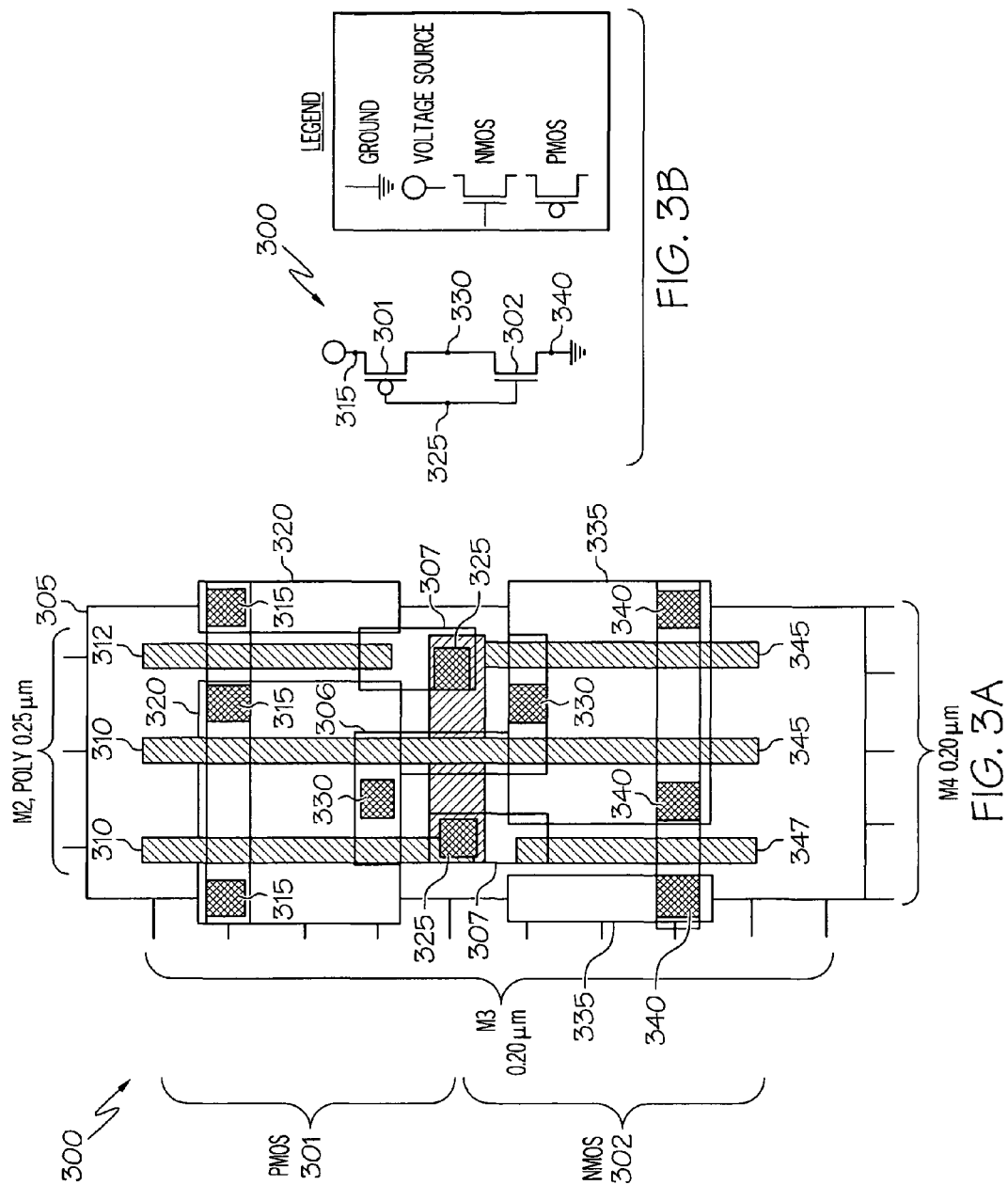

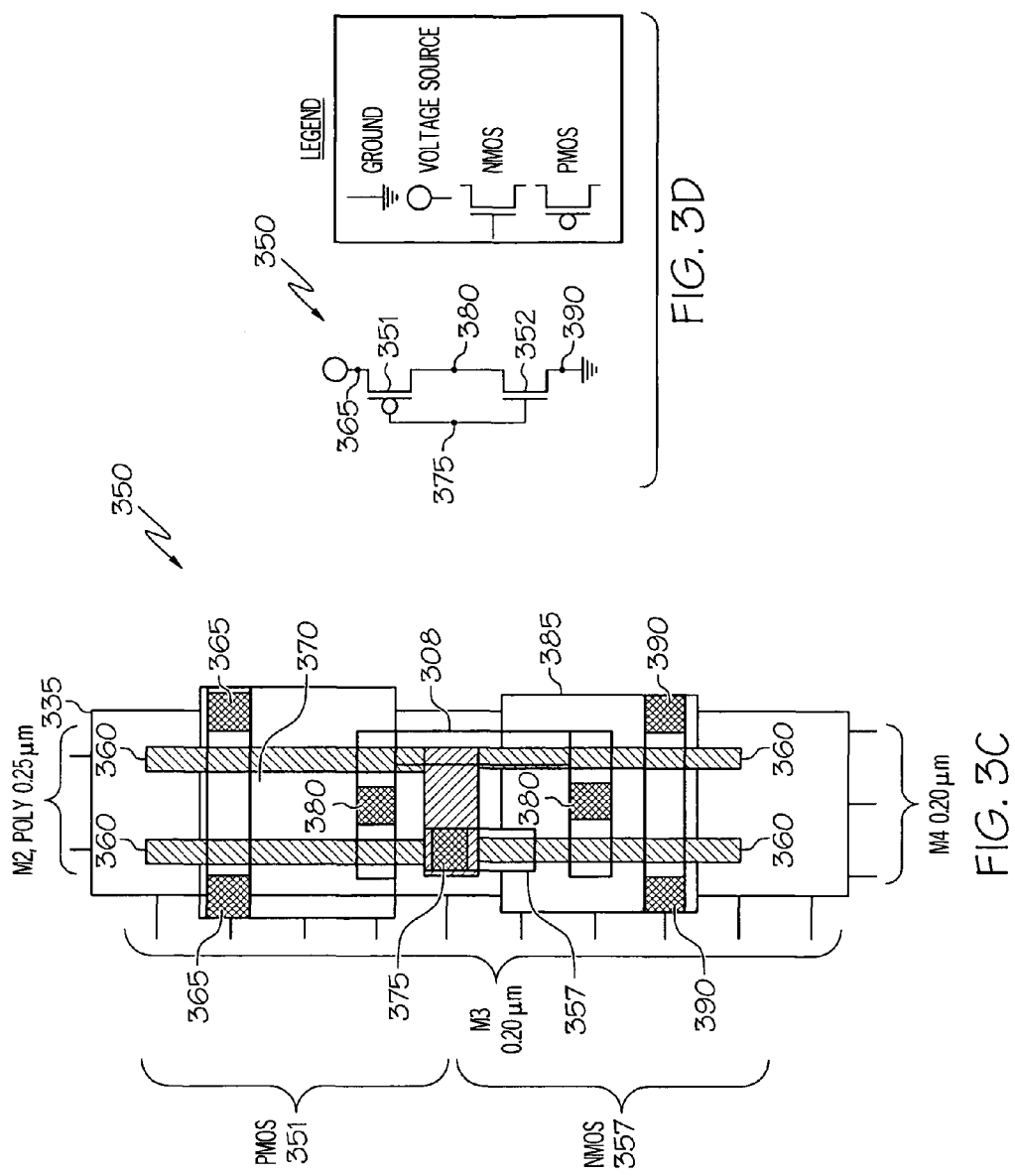

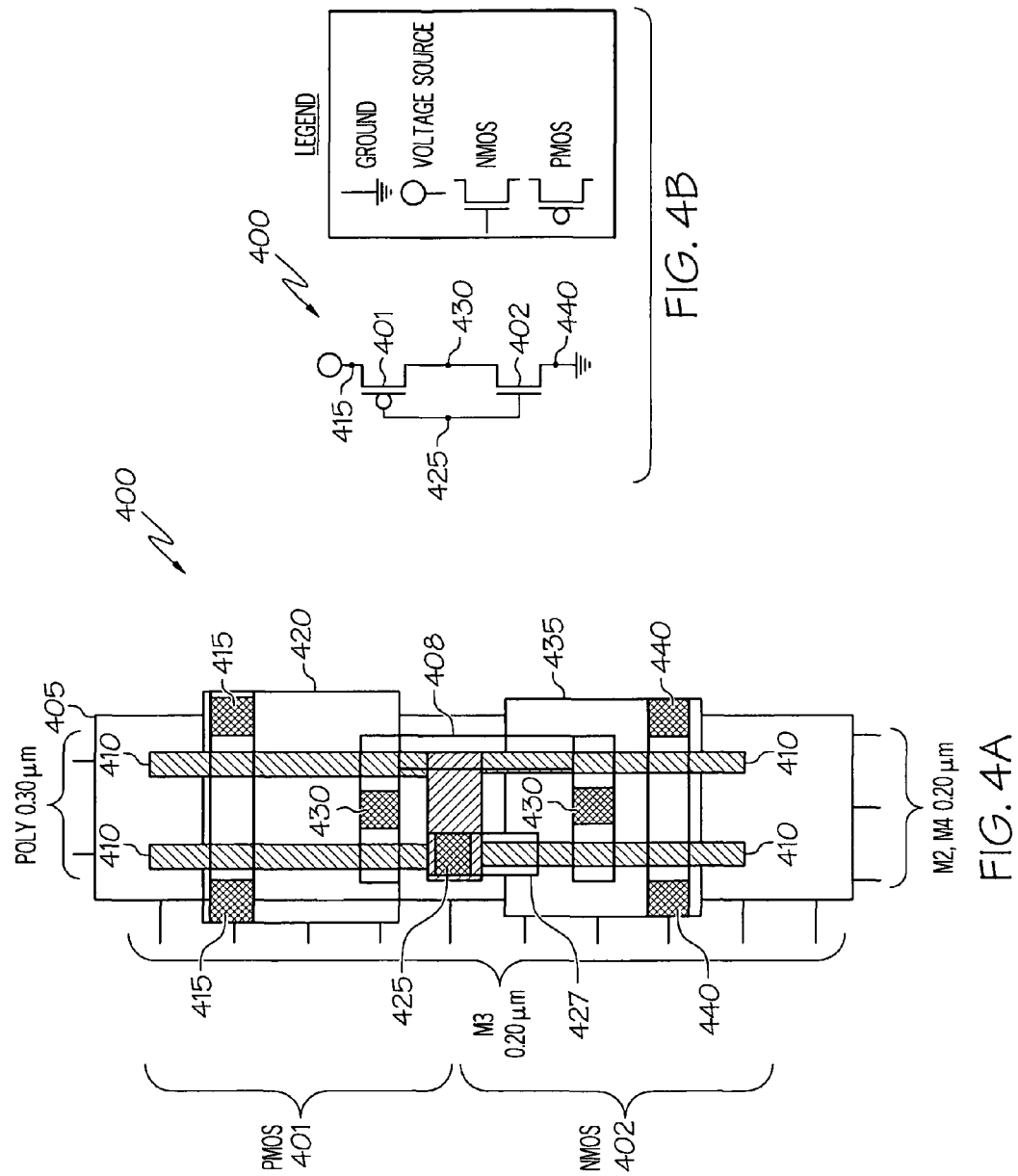

| CIRCUIT | 90 NANOMETER TECHNOLOGY | | 65 NANOMETER TECHNOLOGY | | | | | |
|---|---|---|---|---|---|---|---|---|
| | WITHOUT FIXED POLYSILICON PITCH | | MINIMUM CONTACTED DEVICE PITCH = 0.25 MICROMETER | | MINIMUM CONTACTED DEVICE PITCH = 0.25 MICROMETER | | MINIMUM CONTACTED DEVICE PITCH = 0.30 MICROMETER | |
| | | | M2 PITCH = 0.20 MICROMETER | | M2 PITCH = 0.25 MICROMETER | | M2 PITCH = 0.20 MICROMETER | |
| | CELL WIDTH (# OF M2 TRACKS) | | CELL WIDTH (# OF M2 TRACKS) | AREA SCALAR | CELL WIDTH (# OF M2 TRACKS) | AREA SCALAR | CELL WIDTH (# OF M2 TRACKS) | AREA SCALAR |
| INVERTER | 3 | | 5 | 0.83 | 3 | 0.63 | 3 | 0.5 |
| | 3 | | 5 | 0.83 | 2 | 0.42 | 3 | 0.5 |
| NAND2 | 4 | | 5 | 0.63 | 3 | 0.47 | 6 | 0.75 |

FIG. 5

INTERCONNECT COMPONENTS OF A SEMICONDUCTOR DEVICE

CROSS-REFERENCES TO RELATED APPLICATIONS

This application is a continuation application that claims benefit of the earlier filing date of U.S. patent application Ser. No. 11/167,752, entitled "SYSTEMS AND ARRANGEMENTS TO INTERCONNECT COMPONENTS OF A SEMICONDUCTOR DEVICE", filed on Jun. 27, 2005.

BACKGROUND

The present invention generally relates to the field of integrated circuits. More particularly, the present invention relates to systems and arrangements to interconnect cells and structures within cells formed in a substrate of an integrated circuit to enhance cell density and improve the across chip line variance (ACLV) tolerance for the integrated circuit.

Typical integrated circuit designs incorporate several metallization layers on top of a substrate to interconnect structures of cells formed in the substrate. In current designs, cells typically include complimentary metal oxide semiconductor (CMOS) circuits. CMOS circuits include p-type metal oxide semiconductor (PMOS) and n-type metal oxide semiconductor (NMOS) transistors formed from diffused areas of silicon and polycrystalline silicon, often referred to as polysilicon. The polysilicon areas are formed on top of a gate oxide above the diffused areas to form gates. The polysilicon areas also couple with the diffused areas on opposing sides of the gate to form electrodes for the source and drain of the transistors. Formation of the metallization layers over the substrate facilitates interconnection of the transistors to form more complex devices such as NAND gates, inverters, and the like.

The metallization layers utilize lines and vias to interconnect the transistors in each of the cells as well as to interconnect the cells to form the integrated circuit such as a processor, state machine, or memory. Lines typically reside in parallel paths within each layer. Lines in adjacent layers often run perpendicular to one another although lines in adjacent layers are separated by a non-conductive passivation layer also referred to as an inter-level dielectric layer such as, e.g., silicon oxide. The silicon oxide is etched to form the vias, which interconnect the lines of various metallization layers in accordance with the circuit design. Inputs and outputs of the integrated circuit are brought to a surface with vias to bond the circuits with pins of a chip package. The chip package typically includes an epoxy or ceramic that encloses the integrated circuit to protect the circuit from damage and pins to facilitate a connection between the inputs and outputs of the integrated circuit and, e.g., a printed circuit board.

As generations of integrated circuits are scaled down to increase functionality and speed available in a chip package, designers must continually scale down cell structures to smaller and smaller dimensions to increase the density of cells per area of the substrate. In fact, the scaling theory has predicted that processor sizes will decrease by half in each generation so a 50% area scalar is a goal when designing a new smaller technology generation of integrated circuits. Further, to take advantage of the smaller cells, the lines must be formed at smaller pitches.

In recent technology generations, numerous design constraints and rules have been developed that bound the patterns of cells in an integrated circuit. The rules and constraints take into consideration margins of error in locating the cells in the substrate, ways to reduce the magnitude of leakage, as well as many other considerations to assure the performance of the resulting integrated circuit. Rules delineate minimum distances between structures of cells, lines, vias, and the like. Metal direction relative to the gate material, metal layer chosen for power distribution within the cell, cell height, metal pitch, etc., are all constraints of a chosen pattern or physical layout of the cells. For example, one critical constraint is related to the width of the polysilicon gate material. The width of polysilicon gate material defines the length of the channel of a device. Longer channels add more delay to the response of a device, which is sometimes desirable. Many current designs, however, interconnect two or more short channel devices in series to create long channel devices thus reducing hardships involved with building long channel devices into the integrated circuits.

Another critical constraint is the metal pitch. Metal pitch determines the accessibility of cells so metal pitch directly impacts the cell density of the integrated circuit. Further, the length of interconnections between cells impacts the performance. For instance, longer lines have increased resistance, increasing heat dissipation in the integrated circuit. Longer lines also increase the capacitance of the overall design. Thus, while the first metallization layer is typically set to the tightest wire pitch, all remaining metallization layers of common thickness are constrained to a constant minimum metal pitch that facilitates interconnection of the cells. Current integrated circuits typically have six to eight metallization layers.

To meet such design rules and constraints and to maximize cell density, one semi-custom design technique involves creating a standard library of cells. The cell heights and widths are constrained to integrals of a standard grid so cells may be placed next to each other horizontally and vertically within the grid without violating the rules and constraints for the integrated circuit. The standard grid is an integral of the wiring pitch. Further, the cells are constrained to a constant cell height but the width of each cell may vary to accommodate various cell configurations while maximizing cell density for any combination of cells utilized to build the integrated circuit.

In most cases, the technology minimum ground rules are generally used to define each cell's physical architecture and minimizing the cell width for a particular cell improves the cell density for the integrated circuit. In the past, the polysilicon, or device gate material, was not required to be on a standard or single pitch (width plus space) so the width of the cells could be minimized by placing the polysilicon anywhere such that the minimum polysilicon width plus space was not violated. The minimum space in this context, is the space required to contact a diffusion area with a via/contact between the polysilicon areas.

As technology features grow ever smaller, the ability to process like drawn objects of the same width within a tight tolerance across the chip has become very difficult. This across chip line variance (ACLV) effectively determines the fastest and leakiest devices as well as the slowest devices. Because the designer must address both worst-case and best-case extremes in performance and must also take into account the ever-increasing leakage current associated with very short channel devices, ACLV is receiving increased focus. One way to improve ACLV is to force all polysilicon to be the same width (device or channel length) and for it to be positioned at a common, fixed pitch.

While forcing the polysilicon to be at a fixed pitch improves the ACLV, the cell density is degraded. For instance, when considering development of a standard cell library, one such consideration is the cell wiring pitch. The cell height and width are generally defined as an integer multiple of the wiring pitch so every cell can be accessed via the wiring in the metallization layers. For purposes of the following illustrations, consider metallization layer one, M1, running horizontally and metallization layer two, M2, running vertically (orthogonal to M1). In this manner, all lines on odd numbered metallization layers run horizontally and all lines on even numbered metallization layers run vertically. This orthogonal arrangement, which is generally practiced, allows effective wiring. Accordingly, the width of the cell (horizontal) is generally defined as an integer number of M2 wiring tracks or pitches to allow any circuit to be placed next to any other circuit along the x-axis. Similarly, the height of the cell is an integer number of M1 tracks allowing any circuit to be placed next to any other circuit along the y-axis.

As a first illustration, consider the 90 nanometer (nm) technology and assume the polysilicon is running orthogonal to M1 and in parallel to M2, the M1 pitch is relaxed to match the larger M2 pitch, and the M2 pitch is set to 0.28 micrometer (um). In one 90 nm technology, for instance, the polysilicon gate pitch can be as short as 0.22 um with no requirement for the polysilicon to be positioned at a common, fixed pitch. Thus, the polysilicon gate pitch is smaller than the M2 pitch to allow gates to be placed wherever they produce the best cell density. Note, that the cell width must be a multiple of the 0.28 um M2 pitch to allow any circuit to be placed next to any other circuit on the x-axis as stated above. Hence, any inefficiency in the cell's layout can result in an increase in cell width from n-tracks to n+1 tracks. Stated another way, if the cell layout misses terminating on the M2 wiring track grid by even one layout grid snap, which is typically 0.01 um, then the cell width must be increased to the next minimum step off, or offset, of 0.28 um. This can invoke serious deficiencies in density.

The new design constraint for the 65 nm technology generation of integrated circuits that forces the polysilicon to be placed at a common pitch, removes the ability to adjust the position of the polysilicon to minimize the width of a cell. Thus, to accommodate the standard cell design, the minimum grid with respect to cell width is the least common multiple of the wiring pitch and the polysilicon gate pitch.

In the 65 nm technology, the wiring pitch in the metallization layers is reduced to, e.g., 0.20 um to maximize cell density with respect to the ability to interconnect the smaller cells. Assume also, for example, that the polysilicon pitch is fixed at 0.25 um. Thus, the least common multiple of the metal pitch and the polysilicon pitch is 1.0 um or one micron. In other words, the minimum cell width for this design is five wiring tracks. If the cell design misses 1.0 um by 0.01 um (i.e., the cell width is 1.01 um), the next minimum step off is 2.0 um so the cell is ten wiring tracks wide instead of five wiring tracks wide. As a result, a cell that utilizes six wiring tracks in the 90 nm technology may utilize ten wiring tracks in the 65 nm technology due to the common pitch requirement for the polysilicon, which is a 66% increase in the number of tracks consumed by the cell. Further, many cells in a standard cell library for the 65 nm technology can be designed with a cell width that is smaller than five wiring tracks.

What is needed is a layout strategy for a standard cell design that is consistent with this constant polysilicon pitch requirement to improve ACLV while minimizing the impact of the constant polysilicon pitch on cell density.

SUMMARY

One embodiment comprises a method to form an integrated circuit constrained by a gate pitch. The method generally involves identifying the gate pitch, the gate pitch being a distance between a centerline of a first gate and a centerline of a second gate that facilitates placement of a contact between the gates and in contact with a diffusion area of a substrate; and forming a set of metallization layers over the substrate comprising lines, the lines being substantially parallel to the gates, wherein at least one of the set is an adjusted metallization layer comprising adjusted lines, the adjusted lines being pitched at the gate pitch and substantially aligned with the gates.

Another embodiment comprises an integrated circuit constrained by a gate pitch. The integrated circuit may comprise a substrate comprising gates pitched at the gate pitch, the gate pitch being a distance between a centerline of a first gate and a centerline of a second gate of the gates that facilitates placement of a contact between the first gate and the second gate to contact a diffusion area of a substrate; and a first set of metallization layers formed over the substrate comprising lines, the lines being substantially parallel to the gates, wherein at least one of the first set comprises an adjusted metallization layer comprising adjusted lines, the adjusted lines being substantially parallel to the gates, pitched at the gate pitch, and substantially aligned with the gates.

A further embodiment comprises an integrated circuit constrained by a gate pitch. The integrated circuit may comprise a substrate comprising gates pitched at the gate pitch, the gate pitch being greater than a minimum distance between a centerline of a first gate and a centerline of a second gate of the gates that facilitates placement of a contact between the first gate and the second gate to contact with a diffusion area of a substrate, wherein the gate pitch is adapted to have a common multiple with a wire pitch that is smaller than a lowest common multiple of the minimum distance and the wire pitch; and a set of metallization layers formed over the substrate comprising lines, the lines being pitched at the wire pitch.

BRIEF DESCRIPTION OF THE DRAWINGS

FIGS. 3A-D depict an embodiment of a 65 nm technology CMOS cell for a standard library comprising an adjusted M2 wire pitch;

FIGS. 4A-B depict an embodiment of a 65 nm technology CMOS cell for a standard library comprising a relaxed polysilicon device pitch;

FIG. 5 illustrates a table indicating area scalars from a 90 nm technology to a 65 nm technology for CMOS cells having a standard grid arrangement and two alternative mixed grid arrangements;

DETAILED DESCRIPTION OF EMBODIMENTS

Figure 1:
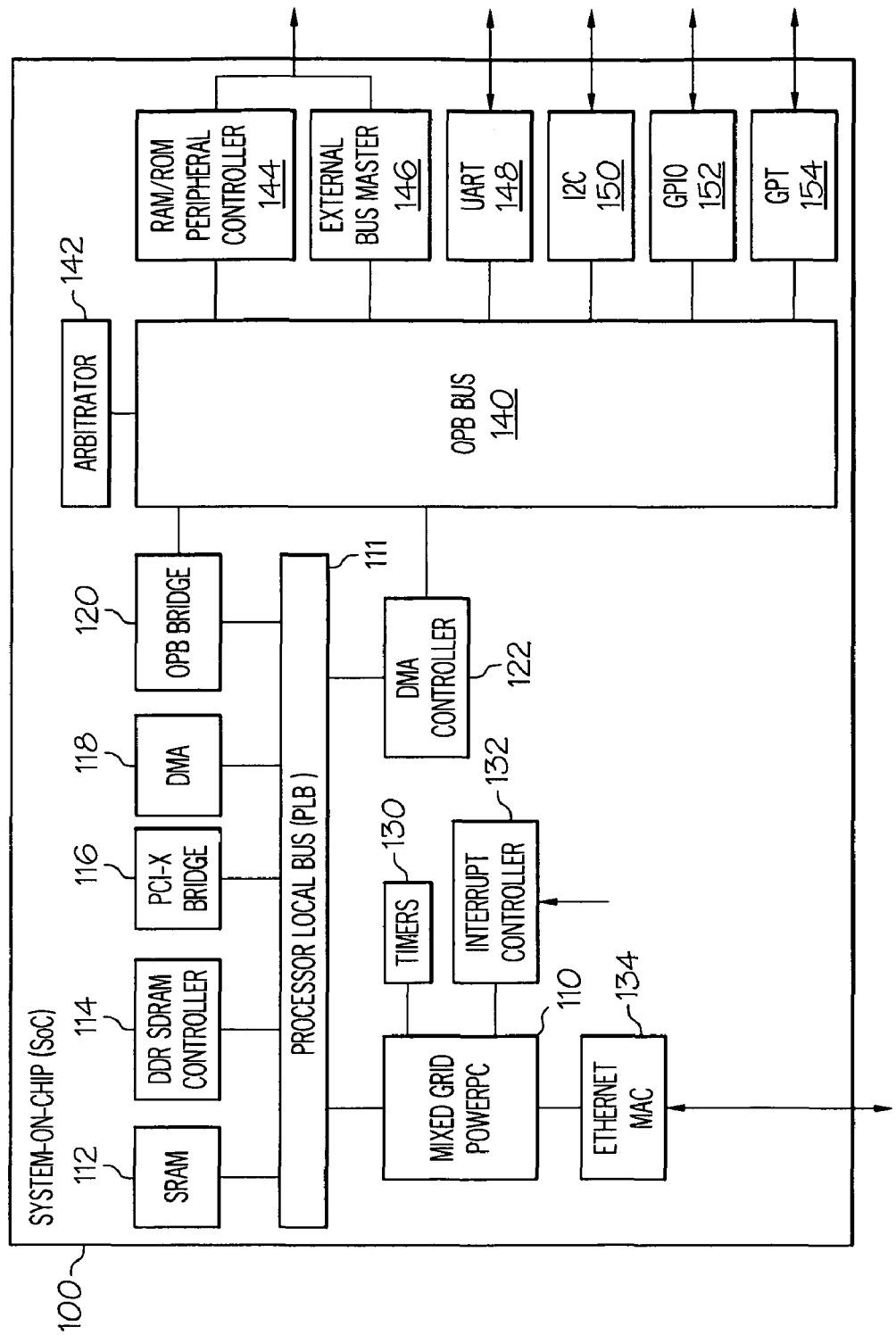
FIG. 1 depicts an embodiment of a system that incorporates an embedded processor having a mixed grid arrangement for increased cell density.

The following is a detailed description of embodiments depicted in the accompanying drawings. However, the amount of detail offered is not intended to limit the anticipated variations of embodiments; but, on the contrary, the intention is to cover all modifications, equivalents, and alternatives falling within the spirit and scope as defined by the appended claims. The detailed descriptions below are designed to make such embodiments obvious to a person of ordinary skill in the art.

Generally speaking, systems and arrangements to interconnect cells and structures within cells formed in a semiconductor substrate of an integrated circuit to enhance cell density are disclosed. Embodiments comprise an adjusted polysilicon gate pitch to metal wire pitch relationship to improve area scalars while increasing ACLV tolerance with a fixed polysilicon gate pitch. In some embodiments, the wire pitch for at least one metallization layer is adjusted to match the pitch for the polysilicon gate. In one embodiment, the lowest metallization layer running in the same orientation as the polysilicon gate, utilized to access the input or output of the interconnected cell structures is relaxed to match the polysilicon gate pitch and the metal is aligned above each polysilicon gate. For instance, if the second metallization layer (M2) is the lowest metal running in the same orientation as the polysilicon gate, vias V1 may be utilized to interconnect metal-1 (M1) that is connected to the polysilicon gates by means of contacts with metal lines of M2. Similarly, if the third metallization layer (M3) is the lowest and in parallel with the polysilicon gate pitch, vias V2 may be utilized to interconnect the polysilicon gates which are connected up to M2 with metal lines of M3.

In an alternative embodiment, the polysilicon gate pitch may be relaxed to attain a smaller lowest common multiple with the wire pitch for an integrated circuit, advantageously reducing the minimum step off. For example, if the minimum polysilicon gate pitch is 0.25 um and the minimum wire pitch is 0.20 um for the integrated circuit, the lowest common multiple is 1.0 um, which is also the minimum step off. Embodiments may advantageously relax the polysilicon gate pitch to, e.g., 0.30 um, to offer a minimum step off of 0.60 um.

While portions of the following detailed discussion describe many embodiments comprising employing a metallization layer two (M2) with an adjusted pitch, upon review of the teachings herein, a person of ordinary skill in the art will recognize that the pitch may be adjusted on a different metallization layers and, in some embodiments, on more than one metallization layers. Further, embodiments discuss polycrystalline silicon gate structures, silicon substrates, metal lines, and the like, but one of ordinary skill in the art will recognize that other materials may substituted for these structures when employed in accordance with similar constraints to perform substantially equivalent functions.

Turning to the drawings, FIG. 1 illustrates an embodiment of a System-on-Chip (SoC) 100. SoC 100 may be a system on a chip with at least one processing element, memory elements, I/O interfaces, and cores attached to a local bus or multiple on-chip buses. More specifically, SoC 100 comprises a mixed grid processing element such as a Mixed Grid PowerPC 110, a local processor bus (PLB) 111, an on-chip peripheral bus (OPB) 140, and a number of supportive components, such as a synchronous random access memory (SRAM) 112, a double data rate (DDR) synchronous dynamic random access memory (SDRAM) controller 114, a Peripheral Component Interconnect-Extended (PCI-X) bridge 116, a direct memory access (DMA) 118 and a DMA controller 122, an Ethernet Medium Access Control (MAC) protocol device 134 employed to provide the data link layer for an Ethernet local area network (LAN) system, processor core timers 130, an interrupt controller 132, and an OPB bridge 120 interfacing with the OPB 140 and PLB 111.

As shown in FIG. 1, other devices provided for interfacing with the OPB 140 include one or more of the following: a random access memory/read only memory (RAM/ROM) Peripheral controller 144, an external bus master 146, a Universal Asynchronous Receiver Transmitter (UART) device 148, an Inter-IC bus (I2C) interface 150, a general purpose I/O interface (GPIO) 152, and a gateway interface (GPT) 154.

In further embodiments, the computational capabilities of SoC 100 may be enhanced, for, e.g., networking applications through the addition of special-purpose processor cores (not shown) attached to the PLB 111, which operate in parallel with Mixed Grid Power PC 110. These additional special-purpose processor cores may utilize small silicon areas by excluding features found in typical general-purpose processors (e.g., a memory management unit to support virtual addressing, etc.).

In other embodiments, Mixed Grid Power PC 110 is not limited to SoC designs, but could also be implemented in standard digital signal processors, micro-controllers, field programmable gate arrays, application specific integrated circuits, and microprocessors.

In the present embodiment, Mixed Grid Power PC 110 may be an embedded processor such as IBM's PowerPC 440 or 405 processor core. Mixed Grid Power PC 110 comprises a high cell density due to a mixed grid arrangement that adjusts a relationship between the device gate pitch and the wire pitch of at least one metallization layer. More specifically, in some embodiments, Mixed Grid Power PC 110 comprises an adjusted M2 metallization wire pitch. The adjusted wire pitch for M2 is equal to the polysilicon gate pitch and aligns the lines of M2 over the centerlines of the polysilicon gates. Such embodiments advantageously reduce area scalars for cells such as the cells described in table 500 of FIG. 5.

In further embodiments, Mixed Grid Power PC 110 comprises a relaxed polysilicon gate pitch. The gate pitch is increased to 0.30 um to reduce the lowest common multiple with the minimum wire pitch from 1.0 um to 0.60 um. Such embodiments also advantageously reduce area scalars for cells such as the cells described in table 500 of FIG. 5.

Figure 2A:
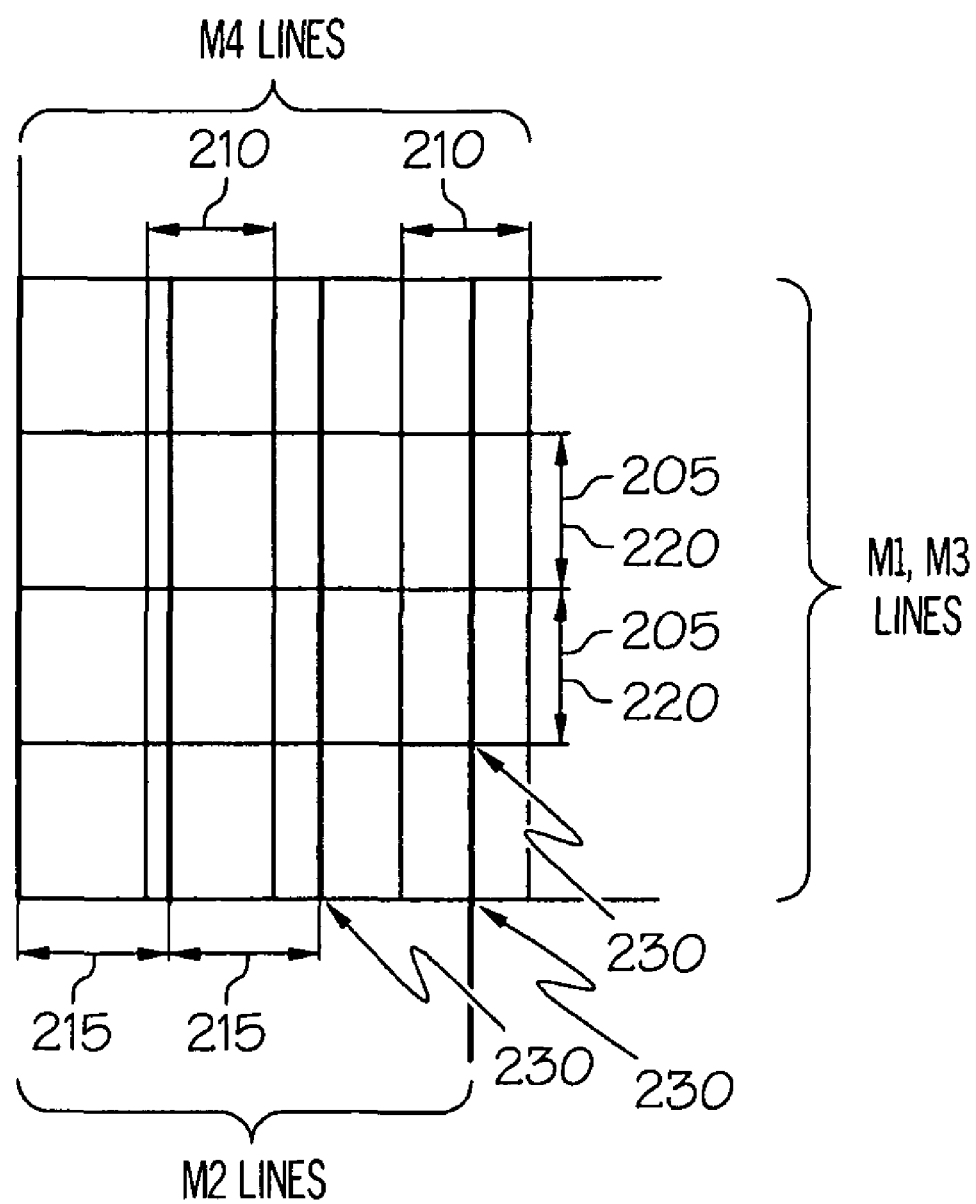
FIGS. 2A-B depict an embodiment in a plane view and cross-section view for metallization layers two through four in a mixed grid arrangement such as the mixed grid arrangement for the embedded processor of FIG. 1.
Figure 2B:
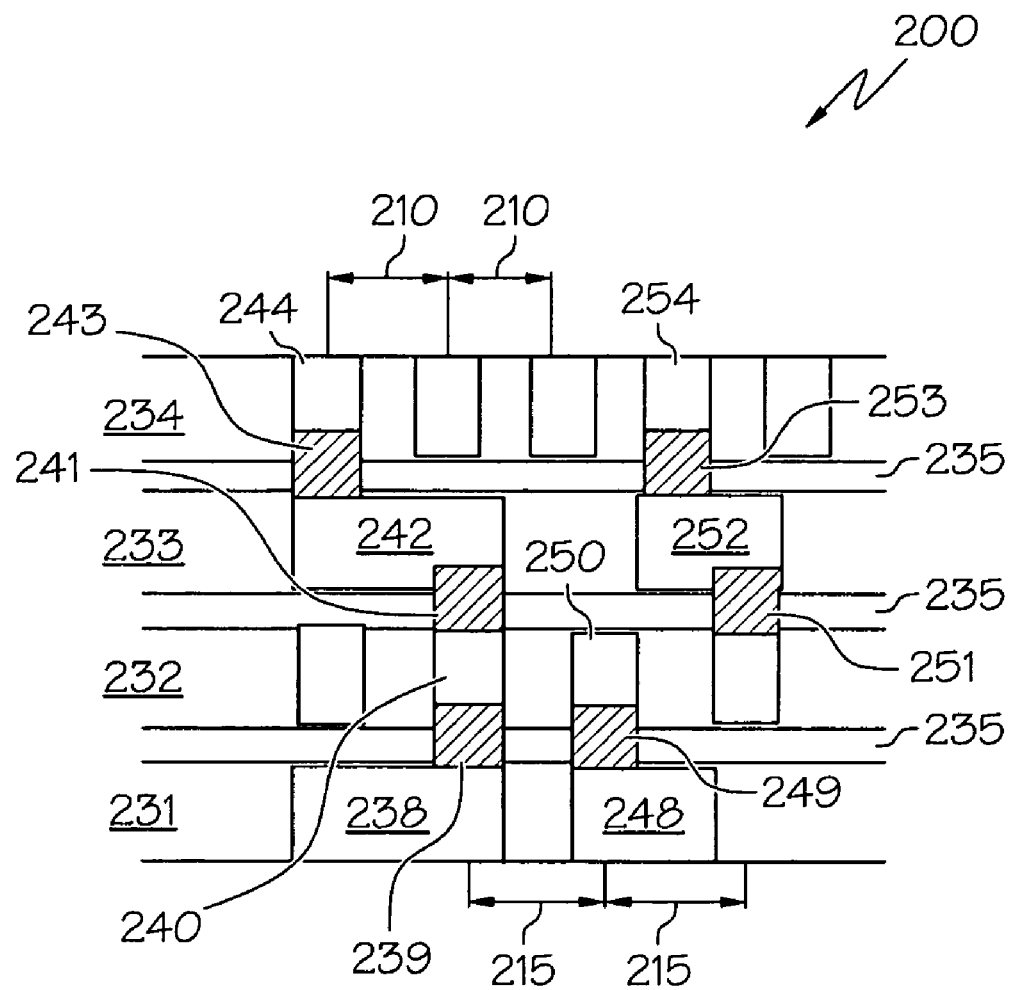

FIGS. 2A-B illustrate an embodiment in a plane view and cross-section view for metallization layers one (M1), two (M2), three (M3), and four (M4) in a mixed grid arrangement such as the mixed grid arrangement employed in Mixed Grid Power PC 110 of FIG. 1. FIG. 2A-B depicts the plane and cross-section view of four metallization layers, M1, M2, M3, and M4 arranged with a relaxed or adjusted M2 wire pitch 215. Metallization layers, which are represented in FIG. 2A by M2 lines, M1/M3 lines, and M4 lines, generally form a grid to facilitate access to cells on a silicon substrate. The metal lines are formed along the designated pathways to interconnect structures of the cells and to connect the cells with other cells to implement logic functions such as functions for, e.g., an arithmetic logic unit (ALU), an adder, a floating point unit (FPU), a pre-decoder, a cache controller, etc.

The lines of M2, M1/M3, and M4 in FIG. 2A represent valid pathways available for the lines of each of these layers, which are separated from each other via non-conductive materials such as a silicon-oxide (SiO2). More specifically, once the cell structures are formed in the silicon substrate, metallization layers are formed over the substrate. Passivation layers 235, as depicted in FIG. 2B, separate each of the metallization layers with non-conductive materials so lines shown in FIG. 2A do not contact one another at intersections unless a via is formed at the intersection.

After forming a passivation layer, a portion of the layer is typically etched away utilizing a photo-resist mask. The etching process removes a depth of the passivation layer at points along the pathways to facilitate creation of the metal lines. Etching removes the entire passivation layer at locations for vias such as intersections 230. Advantageously, the adjusted wire pitch 215 for M2 lines facilitates placement of vias in adjacent intersections 230 for improved V1 redundancy and pin access. In particular, at one or more of locations 230, poly contacts may interconnect M1 lines with polysilicon (not shown), vias V1 may interconnect M2 lines with M1 lines, and vias V2 may interconnect an M2 line with a higher layer line such as an M3 line while satisfying spacing restraints for vias. Further, the increased flexibility in placement of vias and pin access may reduce the lengths of wires interconnecting the cells and, as a result, may reduce the capacitance associated with an integrated circuit such as Mixed Grid Power PC 110 of FIG. 1. Reducing the capacitance can increase performance and decrease power consumption of the integrated circuit.

The M2 wire pitch 215 matches the minimum contacted device pitch, which is also referred to as the minimum contacted gate pitch or poly pitch. As a result, M2 is arranged on a wider pitch than the minimum wire pitch 210 and 220, which is the pitch indicated for M1 lines, M3 lines, and M4 lines. Embodiments such as the embodiment in FIG. 2A may advantageously offer improved area scaling for cells in a standard cell library. For instance, a NAND gate that is four tracks wide in 90 nm technology is five wiring tracks wide in 65 nm technology when M2 lines are pitched at a minimum wire pitch of 0.20 um, which is a 0.63 area scalar. However, by adjusting the pitch of metallization layer M2 to match the fixed gate pitch of 0.25 um, the same NAND gate can be designed to be three tracks wide, which is a 0.47 area scalar as is described in Table 500 of FIG. 5 in the NAND2 row 560 at columns 515, 520, 525, and 530.

Looking now at FIG. 2B, there is shown an illustration of a cross-section of the metallization layers depicted in FIG. 2A. FIG. 2B provides an illustration of how metal lines of the metallization layers M1, M2, M3, and M4, may interconnect structures of a cell as well as cells with other cells of the integrated circuit. M2 layer 232 and M4 layer 234 include lines along a pathway that is perpendicular to the plane of the figure, while the M1 layer 231 and M3 layer 233 include lines that run parallel to the plane of the figure. M2 layer 232 includes lines defined on a constant wire pitch 215, which is substantially equal to and aligned with the pitch of the polysilicon gates (not shown). M1 layer 231, M3 layer 233, and M4 layer 234 include lines that are pitched at the minimum wire pitch 205, 220, and 210 respectively.

FIG. 2B illustrates two separate interconnections. In the first interconnection, line 238 of M1 layer 231 connects with line 240 of M2 layer 232 by means of via 239, via 241 connects line 240 of the M2 layer 232 with line 242 of the M3 layer 233, and via 243 connects line 242 with line 244 of M4 layer 234. In the second interconnection, line 248 of M1 layer 231 connects with line 250 of M2 layer 232 by means of via 249, via 251 connects line 250 of M2 layer 232 with line 252 of M3 layer 233, and via 253 connects line 252 with line 254 of the M4 layer 234. Notice that vias 239 and 249 are located at adjacent M2 layer lines 240 and 250. These vias 239 and 249 may be located at adjacent lines because the relaxed wire pitch of M2 layer 232 provides the minimum spacing for vias, which is inherent to the minimum contacted gate pitch. The allowance of vias, of a same type, associated with two dissimilar nets on two adjacent wiring tracks results in improved circuit pin access. This allowance also permits room for via redundancy to aid design integrity.

Turning now to FIGS. 3A-B, there is shown an embodiment of a 65 nm technology CMOS inverter 300 comprising an adjusted M2 wire pitch of 0.25 um for a standard cell library. In FIG. 3A, inverter 300 shows some major features of the cell while excluding other features for clarity. FIG. 3B depicts a circuit diagram to illustrate the features and interconnections of inverter 300. Boundary 305 shows the extent of inverter 300 which, in accordance with the constraints of the technology, may also be the boundaries of adjacent cells. Note that power contacts 315 and ground contacts 340 include contacts on boundary 305 that are often referred to as power bumpers. These power bumpers may be utilized by both inverter 300 and the adjacent cells.

Inverter 300 comprises PMOS transistors 301 and NMOS transistors 302 interconnected to provide the functionality of an inverter. While PMOS transistors 301 and NMOS transistors 302 are illustrated as single transistors, as can be seen in FIG. 3A, PMOS transistors 301 comprise two transistors in parallel and NMOS transistors 302 comprise two transistors in parallel to increase the capacity of these transistors. The transistors 301 and 302 include polysilicon gates 310 pitched at a minimum contacted gate pitch of 0.25 um and diffusion areas 320 and 335. Note that floating polys 312 and 347 maintain the constant pitch for the polysilicon to preserve the fixed poly pitch for ACLV but may be referred to as "dummy polys" because they are not used to build the transistors 301 and 302. As will be illustrated in FIG. 3C, a dual pfet and nfet comprising an inverter can be laid out in a smaller area (2-tracks wide rather than the illustrated 3-track wide rendition of FIGS. 3A and B) using the same matched M2/polysilicon pitch.

M2 lines are pitched at 0.25 um and substantially aligned with centerlines of all polysilicon including input poly 310 and 345 to facilitate access input poly 310 and 345. As a result of the relaxed wire pitch of the M2 lines, the area scalar of inverter 300 is reduced with respect to the area scalar offered by the minimum wire pitch of 0.20 um. Table 500 of FIG. 5 describes these differences in columns 515, 520, 525, and 530 on the inverter row 550. In many embodiments, the M2 layer is the only metallization layer with this relaxed wire pitch and the remainder of the metallization layers, with the exception of possibly the M1 layer, are set to the minimum wire pitch. For instance, notice that M3 and M4 have a pitch of 0.20 um. However, the M1 layer may also be relaxed to match the 0.20 um minimum wire pitch.

Input contacts 325 couples with the input poly 310 and 345, which may be interconnected to all portions of the polysilicon. The input poly 310 and 345 interconnects the gates of PMOS transistors 301 and NMOS transistors 302. With a sufficiently high voltage applied to input contacts 325, PMOS transistors 301 will turn off and NMOS transistors 302 will turn on. On the other hand, when a sufficiently low voltage is applied to input contacts 325, PMOS transistors 301 will turn on and NMOS transistors 302 will turn off.

The line width of the input poly 310 and 345 substantially determines the length of the channel of both PMOS transistors 301 and NMOS transistors 302. In the present embodiment, the pitch of the input poly 310 and 345 defines the maximum channel length because the pitch is the minimum contacted gate pitch. In the embodiment illustrated in FIGS. 4A-B, the input poly 410 and 445 is pitched at a relaxed pitch of 0.30 um, which is larger than the minimum contacted gate pitch. Thus, the embodiment of FIGS. 4A-B advantageously offer the ability to design a longer channel device by increasing the width of the input poly 410 and 445 while preserving a fixed poly pitch for ACLV.

Referring again to FIGS. 3A-B, output contacts 330 couple the drain of PMOS transistors 301 and the drain of NMOS transistors 302 through output M1 metal 306. The leftmost two power contacts 315 couple the sources of PMOS transistors 301 to a voltage source and the rightmost two ground contacts 340 couple the sources of NMOS transistors 302 with a low voltage source or ground. Input contacts 325 connect input M1 metal 307 to input poly 310. For example, when PMOS transistors 301 are turned on and NMOS transistors 302 are turned off, PMOS transistors 301 provide an electrical path from power contacts 315 to output contacts 330 to pull up the voltage at output contacts 330 toward the voltage of the high voltage source. Similarly, when NMOS transistors 302 are turned on and PMOS transistors 301 are turned off, NMOS transistors 302 provide an electrical path to pull down the voltage at or discharge output contacts 330.

FIGS. 3C-D depict another embodiment of a 65 nm technology CMOS inverter 350 still comprising the adjusted M2 wire pitch of 0.25 um for a standard cell library. In this realization, the inverter layout only requires two M2 tracks, which results in an area scalar of 0.42. Table 500 of FIG. 5 describes this inverter on row 555 in columns 525 and 530. When contrasted with the inverter layout illustrated in FIGS. 3A-B, this realization is significantly more area efficient. Table 500 of FIG. 5 describes differences in columns 515, 520, 525, and 530 on the inverter row 555.

Inverter 350 comprises PMOS transistors 351 and NMOS transistors 352 interconnected to provide the functionality of an inverter. While PMOS transistors 351 and NMOS transistors 352 are illustrated as single transistors, as can be seen in FIG. 3C, PMOS transistors 351 comprise two transistors in parallel and NMOS transistors 352 comprise two transistors in parallel to increase the capacity of these transistors. The transistors 351 and 352 include polysilicon gates, or input poly 360, pitched at a minimum contacted gate pitch of 0.25 um and diffusion areas 370 and 385. Note that in this realization no floating polys are necessary to maintain the constant pitch for the polysilicon to preserve the fixed poly pitch for ACLV.

Output contacts 380 couple the drain of PMOS transistors 351 and the drain of NMOS transistors 352 through output M1 metal 308. The two power contacts 365 couple the sources of PMOS transistors 351 to a voltage source and the two ground contacts 390 couple the sources of NMOS transistors 352 with a low voltage source or ground. Input contact 375 connects input M1 metal 357 to input poly 360. For example, when PMOS transistors 351 are turned on and NMOS transistors 352 are turned off, PMOS transistors 351 provide an electrical path from power contacts 365 to output contacts 380 to pull up the voltage at output contacts 380 toward the voltage of the high voltage source. Similarly, when NMOS transistors 352 are turned on and PMOS transistors 351 are turned off, NMOS transistors 352 provide an electrical path to pull down the voltage at or discharge output contacts 380.

FIGS. 4A-B depict an embodiment of a 65 nm technology CMOS inverter 400 comprising a relaxed polysilicon device pitch of 0.30 um for a standard cell library. Metallization layers have a minimum wire pitch of 0.20 um, advantageously offering a maximum wire density while the relaxed device pitch facilitates an area scalar of 0.5 as described in column 540 of inverter rows 550 and 555 in Table 500 of FIG. 5. Note that inverter 400 is now three minimum pitch wire tracks wide and the relaxed device pitch advantageously provides the opportunity for designers to build longer channel devices with the extra space between polysilicon gates.

FIG. 4A shows some major features of inverter 400 while excluding other features for clarity. FIG. 4B depicts a circuit diagram to illustrate the features and interconnections of inverter 400. As in FIG. 4A, boundary 405 shows the extent of inverter 400 which, in accordance with the constraints of the technology, may also be the boundaries of adjacent cells. Note that power contacts 415 and ground contacts 440 are on boundary 405 and that these power bumpers may be utilized by both inverter 400 and the adjacent cell.

Inverter 400 comprises a PMOS transistor 401 and a NMOS transistor 402 interconnected to provide the functionality of an inverter. The transistors 401 and 402 include polysilicon gates, or input poly 410, and diffusion areas 420 and 435.

Input contact 425 couples with the input poly 410. The input poly 410 interconnects the gates of PMOS transistor 401 and NMOS transistor 402 and input contact 425 connects input poly 410 with input M1 metal 427. Output contacts 430 couple the drain of PMOS transistor 401 and the drain of NMOS transistor 402 through output M1 metal 408. The power contacts 415 couple the source of PMOS transistor 401 to a voltage source and the ground contacts 440 couple the source of NMOS transistor 402 with a low voltage source or ground. Otherwise, inverter 400 operates in substantially the same manner as inverters 300 and 350.

FIG. 5 illustrates a table 500 indicating area scalars from a 90 nm technology to a 65 nm technology for CMOS cells having a standard grid arrangement and two alternative mixed grid arrangements. Column 505 lists common cells for integrated circuits. In particular, column 505 lists two inverters in rows 550 and 555 and a NAND2 gate in row 560. While the advantages of embodiments of the invention are present in other and more complex cells, two representative types of cells are described in detail in table 500. For example, a four to one inverting multiplexor that is 19 wire tracks wide in the 90 nm technology may be designed to occupy 18 tracks in a 65 nm technology with a 0.54 area scalar when the wire pitch of M2 lines is relaxed to the minimum contacted gate pitch of 0.25 um.

The width of the cells for the inverters (rows 550 and 555) as well as the NAND2 gate (row 560) for the 90 nm technology is listed in column 510. The 90 nm technology describes cell arrangements without a fixed, polysilicon gate pitch. The wire pitch for the cells in the 90 nm technology is 0.28 um.

Columns 515 through 540 describe cell widths and area scalars for the inverters and the NAND2 gate for standard wiring and polysilicon arrangements (columns 515 and 520) and for two embodiments of the present invention in columns 525, 530, 535, and 540. Each embodiment in the 65 nm technology restricts cell arrangements with a fixed polysilicon gate pitch. For the 65 nm technology illustrated, the minimum contacted gate pitch is 0.25 um and the minimum wire pitch is 0.20 um.

Columns 515 and 520 describe the width of the cells and area scalars for the cells when the wire pitch for all metallization layers M2 through MX is set to the minimum wire pitch of 0.20 um and the gate pitch is set to the minimum contacted gate pitch of 0.25 um. Note that the area scalars for this standard wiring arrangement are less than desired 50% area scalar. In particular, inverter row 550 indicates an area scalar of 0.83, inverter row 555 indicates an area scalar of 0.83, and the NAND2 gate row 560 indicates an area scalar of 0.63. Area scalars are calculated by dividing the area of silicon occupied by the 65 nm technology cell by the area of silicon occupied by the 90 nm technology cell. For instance, the area for the inverter in row 550 is calculated by multiplying the cell width of five tracks (column 515) by the M2 wire pitch of 0.20 um. This area is divided by the area of the 90 nm technology inverter, which is three tracks times the wire pitch of 0.28 um. In each case, the height of the cell is assumed to scale by the ratio of the 90 nm M3 pitch to the 65 nm M3 pitch.

Columns 525 and 530 describe the width of the cells and area scalars for the cells when the wire pitch for metallization layer M2 equal to the minimum contacted device or gate pitch of 0.25 um and the gate pitch is set to the minimum contacted gate pitch of 0.25 um. Note that the area scalars for this embodiment are, on average, closer to the desired 50% area scalar. In particular, inverter row 550 indicates an area scalar of 0.63, inverter row 555 indicates an area scalar of 0.42, and the NAND2 gate row 560 indicates an area scalar of 0.47. In fact, the area scalar for the inverter of row 555, which is 0.42, is unexpectedly smaller than the best technology scalar known while significantly improving the ACLV tolerance with the fixed gate pitch.

Columns 535 and 540 describe the width of the cells and area scalars for the cells when the wire pitch for all metallization layers M2 through MX is set to the minimum wire pitch of 0.20 um and the gate pitch is relaxed to reduce the lowest common multiple with the wire pitch. In the present embodiment, the gate pitch is relaxed 20% to 0.30 um to reduce the lowest common multiple to 0.60 um from the 1.0 um of the standard wiring arrangement in columns 515 and 520. Note that the area scalars for this embodiment are also, on average, closer to the desired 50% area scalar. In particular, inverter row 550 indicates an area scalar of 0.50, inverter row 555 indicates an area scalar of 0.50, and the NAND2 gate row 560 indicates an area scalar of 0.75.

Figure 6:
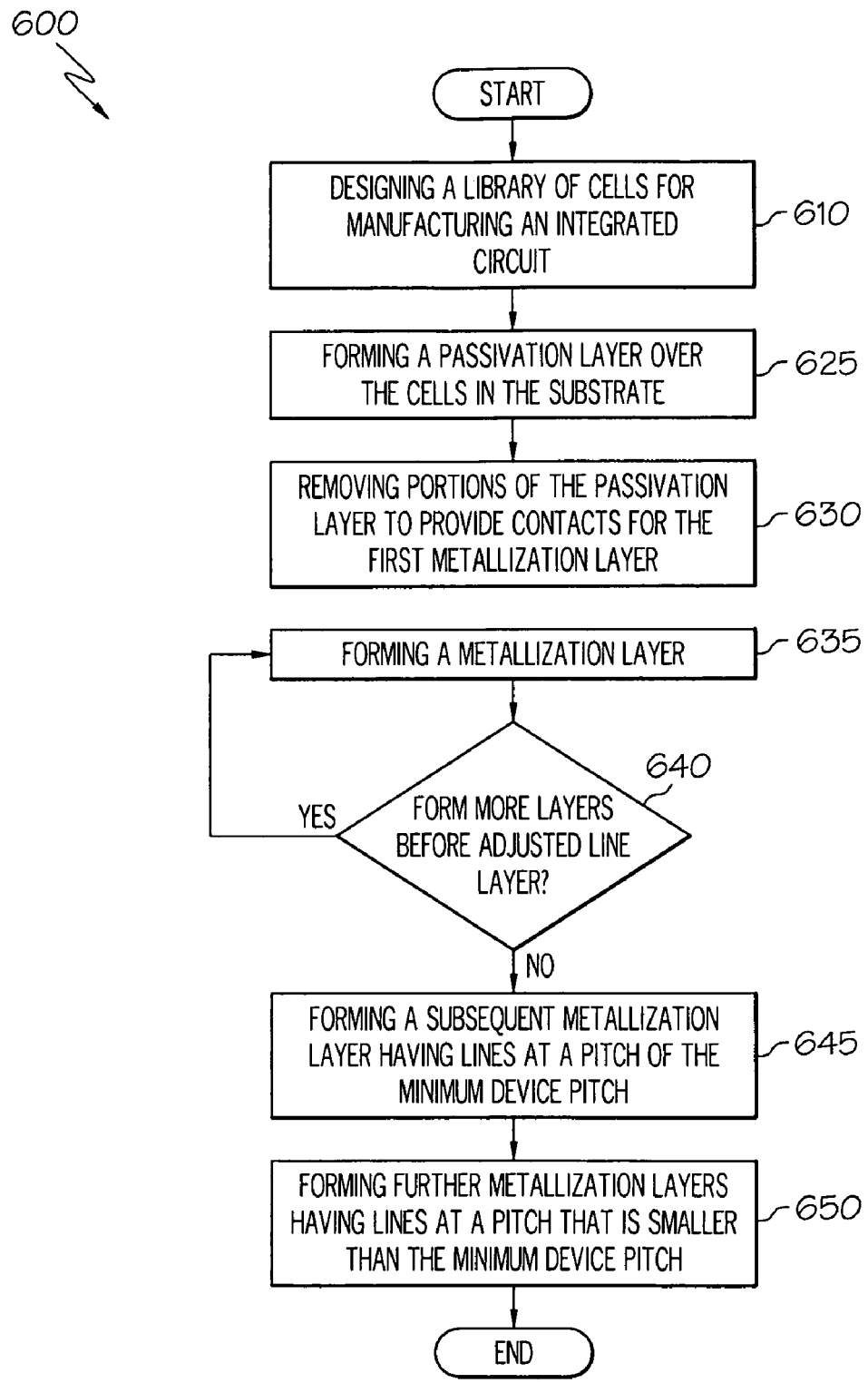
FIG. 6 depicts a flowchart of an embodiment to form an integrated circuit with an adjusted wire pitch.

FIG. 6 depicts a flowchart 600 of an embodiment to form an integrated circuit with an adjusted metallization wire pitch for at least one metallization layer. Flowchart begins with the definition of the minimum contacted device or gate pitch to be employed with designing a library of cells for manufacturing the integrated circuit (element 610). In standard cell designs, various cells that will be implemented in the integrated circuit are designed to meet the constraints of the technology. In many embodiments, each cell in the standard library is designed to facilitate location of the cell next to any other cell along an x-axis and/or y-axis on a silicon substrate. The only dimension that varies, in many embodiments, may be the width of the cell, advantageously allowing customization of the cells while allowing ease of placement.

Once the standard library is built, cells may be formed by a variety of processes. For instance, through a series of masking, etching, and the like, polysilicon gates may be formed on the surface of the substrate. Then, portions of the substrate may be doped by ion implantation, to form n-wells and p-wells for NMOS and PMOS transistors. After polysilicon is formed to define the gate, drain and source regions, portions of the drain and source regions may be further doped to form p+ and n+ regions.

Once the cell structures and gates are formed, a passivation layer such as silicon oxide may be formed over the surface (element 625) prior to forming metallization layers to interconnect the cell structures. To form the metallization layers, portions of the passivation layer may be etched away to form metal lines in a pre-determined pattern for the metallization layer (element 630).

After the surface of the substrate is prepared for the metal lines, metal is applied to the surface, filling in the etched lines and covering the surface (element 635). The surface may then be planarized to remove excess metal and another passivation layer is formed over the metal to separate the metal layer from other metal layers with a non-conductive material. This process of applying metallization layers may be repeated until the metallization layer that is designated to contact the input and output contacts for each cell (element 640). In some embodiments, only metallization layer one may be formed up to this point. In further embodiments, additional layers such as metallization layers two and/or three may be formed.

Once reaching the metallization layer that is designated to contact the input and output contacts for each cell, a subsequent metallization layer such as metallization layer M2 is formed with lines aligned above the centers of the polysilicon gates, having a pitch of the minimum contacted device pitch (element 645). In some embodiments, more than one such metallization layer may be formed.

Additional metallization layers may then be formed that have a wire pitch equal to the minimum wire pitch or other pitch that is smaller than the minimum device pitch (element 650). In other embodiments, more than one metallization layers having a relaxed pitch may be formed at different metallization layers such as metallization layers M2, M4, and/or M6.

Figure 7:
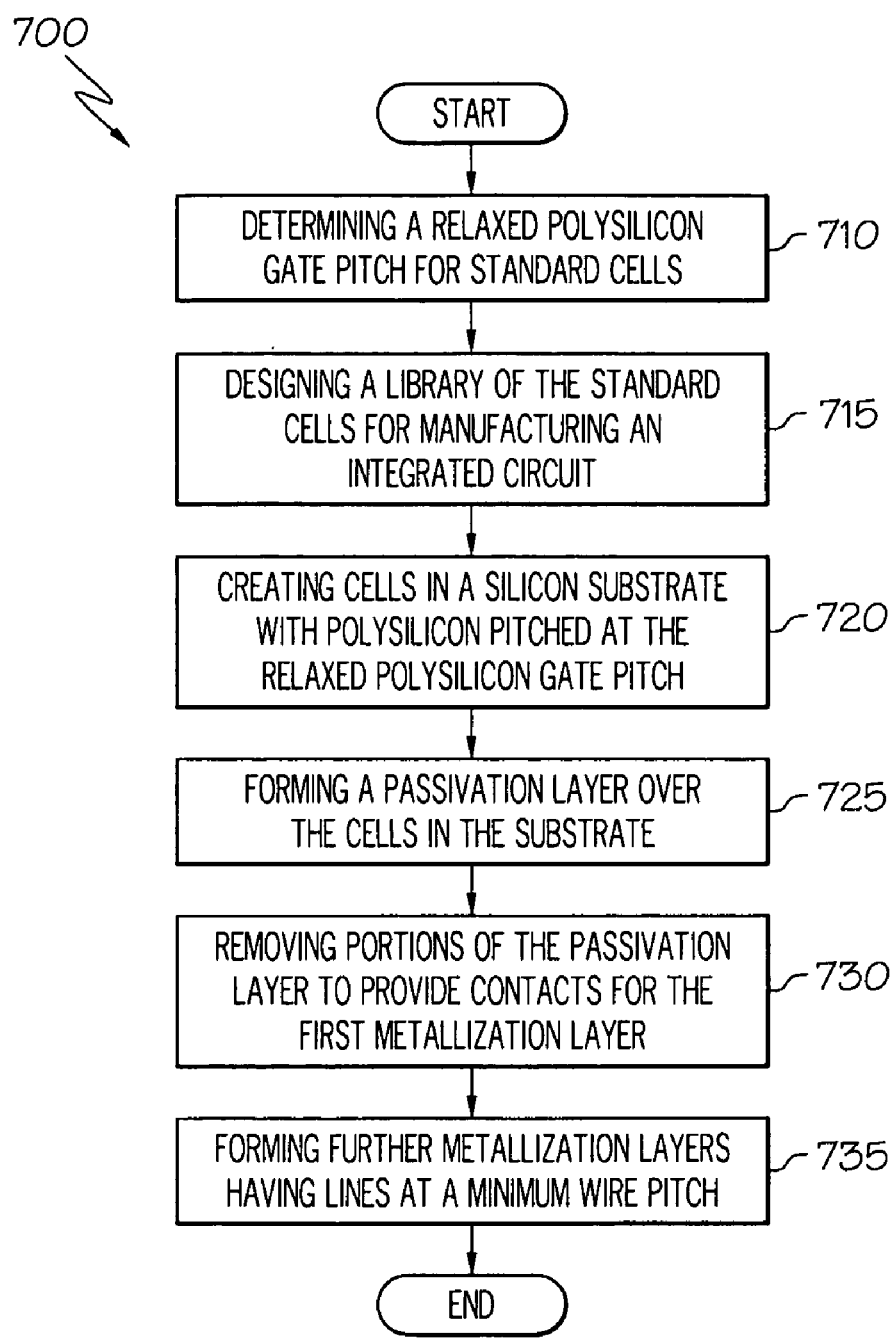
FIG. 7 depicts a flowchart of an embodiment to form an integrated circuit with a relaxed polysilicon gate pitch.

FIG. 7 depicts a flowchart 700 of an embodiment to form an integrated circuit with a relaxed polysilicon device pitch. Flowchart 700 begins with determining a relaxed polysilicon gate pitch for standard cells (element 710). Designers may determine an advantageous relaxed polysilicon gate pitch that reduces the lowest common multiple of the gate pitch and minimum wire pitch. In other embodiments, the selected wire pitch may vary from the minimum wire pitch and the determination of the polysilicon gate pitch may take that wire pitch into account.

Upon determining the relaxed gate pitch, a standard cell library is created for manufacturing the integrated circuit (element 715). Further embodiments may incorporate more customized cells than a strict standard cell design. The cells are then created on a substrate with the polysilicon gates pitched at the relaxed gate pitch (element 720).

After forming the cell structures and the polysilicon gates, a passivation layer is formed over the substrate (element 725). Portions of the passivation layer may be removed via negative and/or positive photo-resist masking and etching to provide poly contacts for the first metallization layer (element 730). Then, metallization layers are formed over the surface of the substrate with lines pitched at a minimum wire pitch to interconnect the cell structures and interconnect the cells (element 735).

Another embodiment is implemented as a program product for use with a system to simulate and/or control semiconductor manufacturing integrated circuits in accordance with, e.g., flowchart 600 and/or 700 as shown in FIGS. 6 and 7. The program(s) of the program product defines functions of the embodiments (including the methods described herein) and can be contained on a variety of data and/or signal-bearing media. Illustrative data and/or signal-bearing media include, but are not limited to: (i) information permanently stored on non-writable storage media (e.g., read-only memory devices within a computer such as CD-ROM disks readable by a CD-ROM drive); (ii) alterable information stored on writable storage media (e.g., floppy disks within a diskette drive or hard-disk drive); and (iii) information conveyed to a computer by a communications medium, such as through a computer or telephone network, including wireless communications. The latter embodiment specifically includes information downloaded from the Internet and other networks. Such data and/or signal-bearing media, when carrying computer-readable instructions that direct the functions, represent embodiments.

In general, the routines executed to implement the embodiments, may be part of an operating system or a specific application, component, program, module, object, or sequence of instructions. The computer program typically is comprised of a multitude of instructions that will be translated by a computer into a machine-readable format and hence executable instructions. Also, programs are comprised of variables and data structures that either reside locally to the program or are found in memory or on storage devices. In addition, various programs described hereinafter may be identified based upon the application for which they are implemented in a specific embodiment of the invention. However, it should be appreciated that any particular program nomenclature that follows is used merely for convenience, and thus the embodiments should not be limited to use solely in any specific application identified and/or implied by such nomenclature.

It will be apparent to those skilled in the art having the benefit of this disclosure that this disclosure contemplates methods and arrangements to interconnect cells and structures within cells formed in a semiconductor substrate of an integrated circuit to enhance cell density. It is understood that the forms shown and described in the detailed description and the drawings are to be taken merely as examples. It is intended that the following claims be interpreted broadly to embrace all the variations of the embodiments disclosed.

Although some embodiments and some of their advantages have been described in detail, it should be understood that various changes, substitutions and alterations can be made herein without departing from the spirit and scope as defined by the appended claims. Further, embodiments may achieve multiple objectives but not every embodiment falling within the scope of the attached claims will achieve every objective. Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding embodiments described herein may be utilized. Accordingly, the appended claims are intended to include within their scope such processes, machines, manufacture, compositions of matter, means, methods, or steps.

What is claimed is:

1. A system comprising:
   a bus;
   a memory controller coupled with the bus; and
   a processing element coupled with the bus, wherein the processing element comprises:
     a substrate comprising gates pitched at a gate pitch, the gates comprising a first gate and a second gate with a contact between the gates, wherein the gate pitch is a distance between a centerline of the first gate and a centerline of the second gate that facilitates placement of the contact between the first gate and the second gate to contact a diffusion area of the substrate;
     a first set of metallization layers formed over the substrate comprising lines, the lines being substantially parallel to the gates, wherein the first set comprises an adjusted metallization layer comprising adjusted lines, the adjusted lines being substantially parallel to the gates, pitched at the gate pitch, and substantially vertically aligned with the gates, and the first set comprises at least one other metallization layer, wherein the at least one other metallization layer comprises at least some of the lines pitched at a wire pitch, the wire pitch being different from the gate pitch, wherein the lines of the adjusted metallization layer connect to cell structures of the substrate with contacts; and
     a second set of metallization layers formed over the substrate comprising lines, the lines being orthogonal to the gates, wherein lines of the first set of metallization layers interconnect with lines of the second set of metallization layers with vias to form circuitry of the processing element.

2. The system of claim 1, wherein the memory controller comprises a dynamic random access memory controller.

3. The system of claim 1, wherein the processing element comprises a processor.

4. The system of claim 1, wherein the processing element further comprises at least two vias coupled with the adjusted lines and formed at wiring tracks of a wiring grid formed by the adjusted metallization layer, wherein the at least two vias are associated with at least two dissimilar nets.

5. The system of claim 1, wherein the second set of metallization layers comprises lines pitched at a minimum wire pitch.

6. The system of claim 1, wherein the substrate comprises the gates, the gates being pitched at a minimum contacted gate pitch.

7. The system of claim 1, wherein the system comprises a machine-readable design on a tangible medium.

8. A system comprising:
   a bus;
   a memory controller coupled with the bus; and
   a processing element coupled with the bus, wherein the processing element comprises:
     a substrate comprising gates pitched at a gate pitch, the gates comprising at least a first gate and a second gate with a contact between the first gate and the second gate, the gate pitch being greater than a minimum distance between a centerline of the first gate and a centerline of the second gate that facilitates placement of the contact between the first gate and the second gate to contact with a diffusion area of the substrate, wherein the gate pitch has a common multiple with a wire pitch that is smaller than a lowest common multiple of the minimum distance and the wire pitch, wherein the substrate comprises a cell, wherein a width of the cell is an integer multiple of a least common denominator of the wire pitch and the gate pitch; and
     a set of metallization layers formed over the substrate comprising lines, the lines being pitched at the wire pitch, wherein the lines of the set of metallization layers connect to cell structures of the cell with the contact and other contacts, the lines of the set of metallization layers interconnecting with vias to form circuitry of the processing element.

9. The system of claim 8, further comprising random access memory coupled with the bus, a direct memory access controller coupled with the bus, and a bridge coupled with the bus.

10. The system of claim 8, further comprising another set of metallization layers comprising lines pitched at a different wire pitch, wherein the lines of the other set of metallization layers interconnect with the lines of the set of metallization layers with vias to form the circuitry.

11. The system of claim 8, wherein the set of the metallization layers comprises a first subset comprising the lines, wherein the lines are orthogonal to the gates.

12. The system of claim 8, wherein the set of the metallization layers comprises a second subset comprising the lines, wherein the lines are parallel to the gates.

13. The system of claim 8, wherein the substrate comprises transistors with a channel length, which is between the minimum distance and the gate pitch.

14. The system of claim 8, wherein the system comprises a machine-readable design on a tangible medium.

15. An integrated circuit constrained by a gate pitch, the integrated circuit comprising:

a substrate comprising memory elements, interfaces and at least one mixed grid processing element, the mixed grid processing element comprising a substrate comprising gates pitched at a gate pitch, the gates comprising a first gate and a second gate with a contact between the gates, wherein the gate pitch is a distance between a centerline of the first gate and a centerline of the second gate that facilitates placement of the contact between the first gate and the second gate to contact a diffusion area of the substrate;

a first set of metallization layers formed over the substrate comprising lines, the lines being substantially parallel to the gates, wherein the first set comprises an adjusted metallization layer comprising adjusted lines, the adjusted lines being substantially parallel to the gates, pitched at the gate pitch, and substantially vertically aligned with the gates, and the first set comprises at least one other metallization layer, wherein the at least one other metallization layer comprises at least some of the lines pitched at a wire pitch, the wire pitch being different from the gate pitch, wherein the lines of the adjusted metallization layer connect to cell structures of the substrate with contacts; and a second set of metallization layers formed over the substrate comprising lines, the lines being orthogonal to the gates, wherein lines of the first set of metallization layers interconnect with lines of the second set of metallization layers with vias to form circuitry of the at least one mixed grid processing element.

16. The integrated circuit of claim 15, further comprising random access memory coupled with the bus, a direct memory access controller coupled with the bus, and a bridge coupled with the bus.

17. The integrated circuit of claim 15, wherein the system comprises a machine-readable design on a tangible medium.

18. The integrated circuit of claim 15, wherein the second set of the metallization layers comprise lines pitched at the second wire pitch, wherein the lines pitched at the second wire pitch are orthogonal to the gates.

19. The integrated circuit of claim 15, wherein the second set of the metallization layers comprises the lines pitched at the second wire pitch, wherein the second wire pitch is a minimum wire pitch.

20. The integrated circuit of claim 15, wherein the at least one cell is an integer multiple of a least common denominator of the first wire pitch and the gate pitch, the gate pitch being a relaxed contacted gate pitch.

* * * * *